(12) United States Patent
Nohara

(10) Patent No.: US 6,281,871 B1
(45) Date of Patent: *Aug. 28, 2001

(54) LIQUID CRYSTAL DRIVE CIRCUIT

(75) Inventor: Kazunori Nohara, Hirakata (JP)

(73) Assignee: Sanyo Electric Co., Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 19 days.

(21) Appl. No.: 09/104,640

(22) Filed: Jun. 25, 1998

(30) Foreign Application Priority Data

Jun. 30, 1997 (JP) ...................................... 9-174342

(51) Int. Cl.⁷ ...................................................... G09G 3/36
(52) U.S. Cl. ................................. 345/100; 345/87; 345/92
(58) Field of Search ................................ 345/94, 87, 100, 345/92

(56) References Cited

U.S. PATENT DOCUMENTS

| 5,815,134 | * | 9/1998 | Nishi | 345/94 |
| 5,835,074 | * | 11/1998 | Didier et al. | 345/94 |
| 5,903,247 | * | 5/1999 | Howard et al. | 345/87 |
| 6,121,945 | * | 9/2000 | Tanaka et al. | 345/94 |
| 6,133,895 | * | 10/2000 | Huang | 345/94 |
| 6,140,989 | * | 10/2000 | Kato | 345/89 |

* cited by examiner

Primary Examiner—Richard Hjerpe
Assistant Examiner—Kimnhung Hguyen
(74) Attorney, Agent, or Firm—Fish & Richardson P.C.

(57) ABSTRACT

A liquid crystal drive circuit for charging video signals to an active matrix type liquid crystal panel as two AC signals in relation to polarity inversion of an opposed electrode, characterized in that it is provided with an amplifier for delivering an inverted video signal and a non-inverted video signal and with a mixer circuit for offsetting AC components by mixing the inverted video signal and said non-inverted video signal, thereby regulating a DC level of said amplifier on the basis of an output signal from the mixer circuit.

7 Claims, 7 Drawing Sheets

LIQUID CRYSTAL DRIVE CIRCUIT

RELATED APPLICATIONS

The present invention claims priority from Japan Patent Application Serial No. Hei 9-174342, filed on Jun. 30, 1997, which is incorporated herein by this reference in its entirety.

BACKGROUND OF THE INVENTION

The present invention relates to a liquid crystal drive circuit for applying video signals to a liquid crystal panel, particularly a liquid crystal drive circuit capable of regulating the DC voltage levels of signals for three primary colors of Red, Green and Blue (R,G and B respectively).

Generally, continuously charging a liquid crystal panel with DC voltage may cause deterioration or burn of the liquid crystal, which will finally lead to its destruction. For this reason, it is necessary to drive the liquid crystal panel with alternating current signals so as to prevent it from being charged with DC. Also, in the case of displaying a fully colored image by video signals, respective R, G and B signals are provided to the liquid crystal panel after they are converted into alternating current, but due to the fact that the center potential of the respective color signals differs from that of the opposed electrode, troubles occur, such as the above-mentioned burn, difference in white balance, or degradation of contrast.

SUMMARY OF THE INVENTION

Since the respective R, G and B signals require, as a matter of course, three video signal drive circuit systems, in order to make the center voltage even among the R, G and B signals, it is necessary to regulate each circuit or to minimize the difference between the respective circuits.

In accordance with one embodiment of the present invention, a liquid crystal drive circuit provides video signals to an active matrix type liquid crystal panel as two AC signals in relation to polarity inversion of an opposed electrode with an amplifier for delivering an inverted video signal and a non-inverted video signal and with a mixer circuit for offsetting AC components by mixing the inverted video signal and said non-inverted video signal, thereby regulating a DC level of said amplifier on the basis of an output signal from the mixer circuit.

An object of one embodiment of the present invention is to realize a greater reduction of the center potential difference in AC signal output between RGB than that in the prior art and, particularly in case of AC signals having outputs having a phase difference of 180°, effectively reducing the DC difference between them. To realize this object, a circuit for adding an inverted output and a non-inverted output of a video signal is provided, in which the potential resulted from the addition is compared with the reference potential and the error voltage is fed back to the center voltage of the inverted video signal and the non-inverted video signal, the center voltage of the AC signals is set to an approximate value of the reference voltage. Also, the inverted video signal and the non-inverted video signal are amplified to a level at which they are applied to the liquid crystal panel, in order to further reduce the center potential voltage, in the stage prior to a multiplexer which mixes the inverted video signal and the non-inverted video signal to form a drive signal symmetrical to the center voltage.

DETAILED DESCRIPTION

Figure 1:
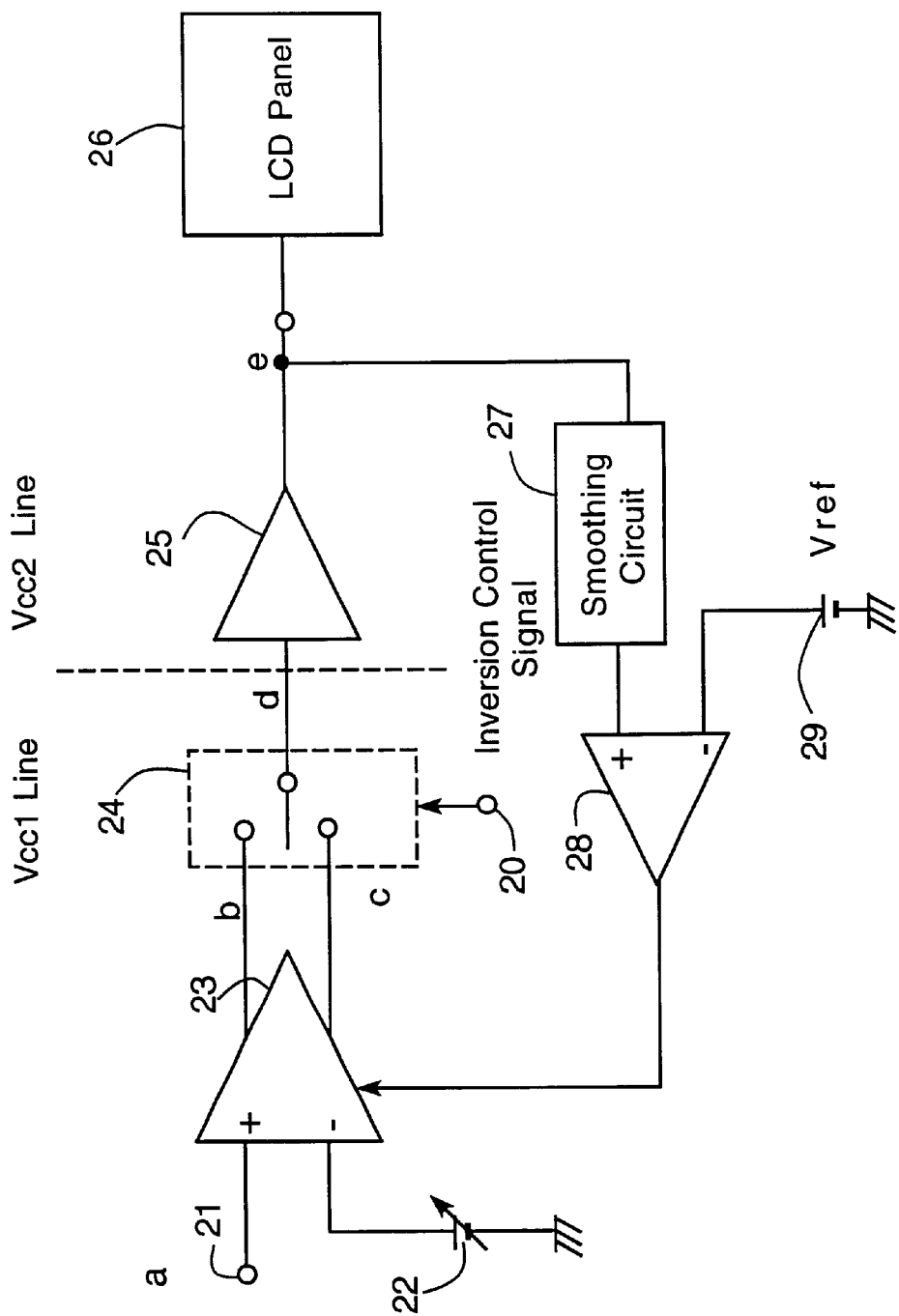
FIG. 1 is a block diagram showing a prior art liquid crystal drive circuit.

Generally, in prior art systems, liquid crystal drive circuits are integrated and, in order to minimize the difference in the center potential between R, G and B signals, feedback has been applied to every circuit of the respective systems in accordance with an arrangement shown in FIG. 1.

Figure 2:
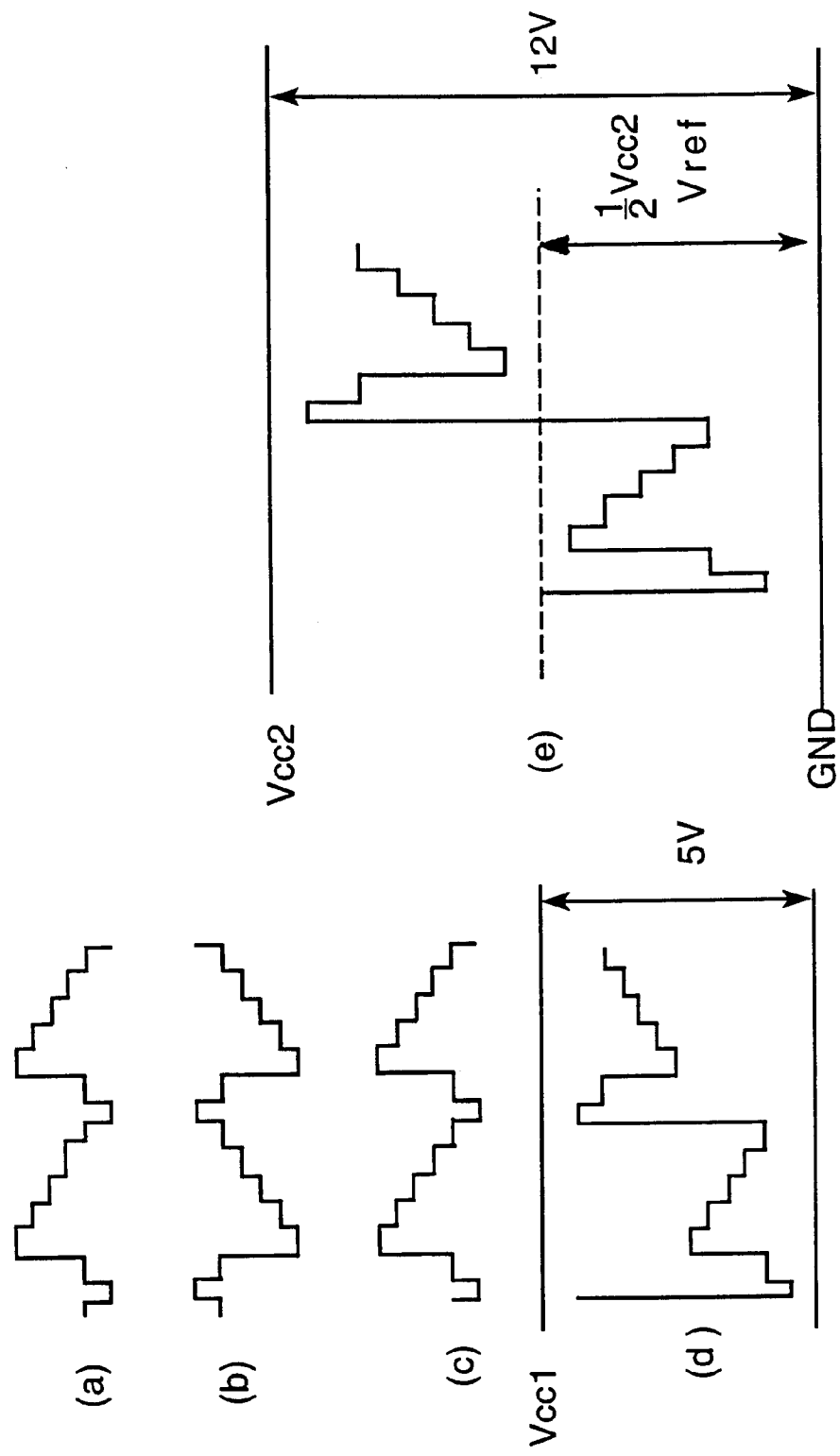
FIG. 2 is an illustration of wave patterns used in description of operation of a prior art liquid crystal drive circuit.

FIG. 2 shows wave patterns of respective sections shown in FIG. 1. A video signal is decoded and either one of the three primary color video signals (RGB) is applied to an input terminal 21. A bias circuit 22 is provided in which, in general, the potential is varied to cause an output DC potential of a differential output amplifier 23 to vary thereby adjusting brightness. A multiplexer 24 is provided in which an inverted output b and a non-inverted output c from the differential output amplifier 23 are selected by an inversion control signal at control terminal 20, with the result that an AC signal d is produced. In an amplifier 25, the AC signal d is amplified to a level required for driving the liquid crystal panel and then input into the liquid crystal panel. In general, to limit electrical power requirements, the circuit block is divided into section with a lower power source $V_{CC1}$ (approx. 5V) and a section having a higher power source $V_{CC2}$ (approx. 12V) at a border shown with dashed lines in FIG. 1. The AC component of the signal e applied to the liquid crystal panel 26 is smoothed in a smoothing circuit 27 and compared in a comparator 28 to the reference voltage $V_{ref}$ from the reference power source 29 and the comparator 28 output is fed back to a bias current of the differential output amplifier 23 so that the center potential of the AC signal is conformed to the reference voltage $V_{ref}$.

Accordingly, when prior art circuits of the FIG. 1 type are provided separately for RGB signals and the reference power source 29 is used in common, DC can be made equal among RGB to each other so that the liquid crystal panel can be properly driven.

However, in the prior art circuits shown in FIG. 1, it is a problem that signals having high amplitude and low frequency could be fed mingled in the DC component, as shown in FIG. 2(e). In that case, an output DC drifts in response to said signal component.

Figure 3:
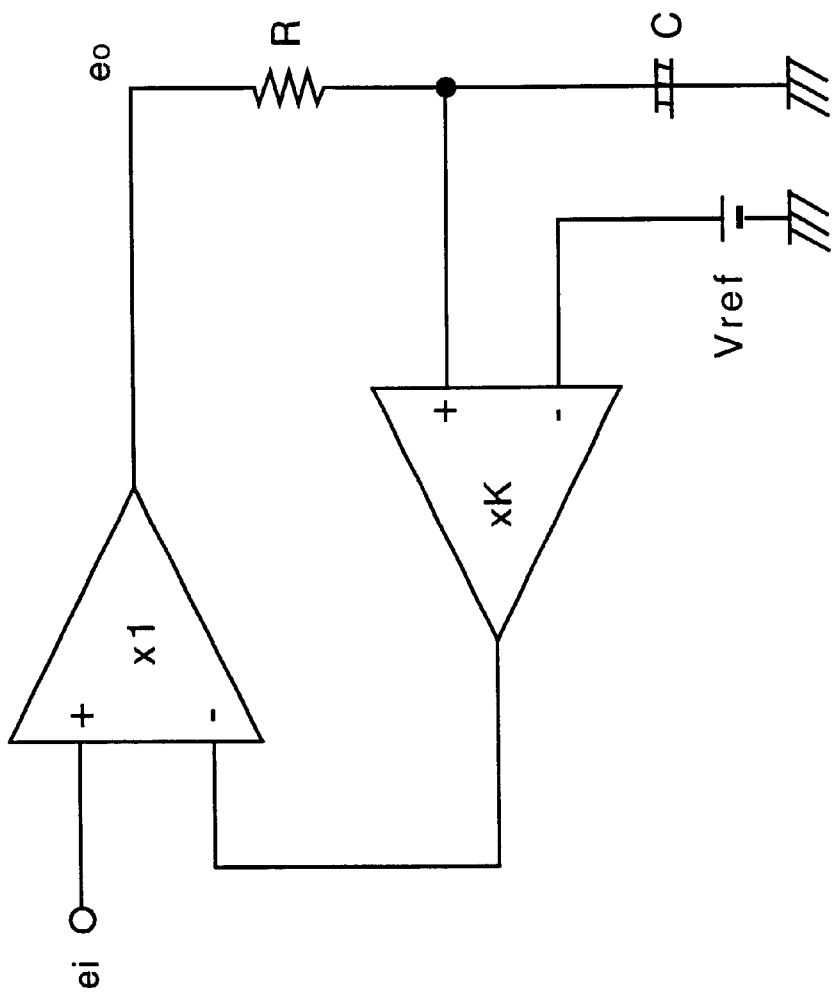
FIG. 3 is a circuit diagram used in description of operation of a prior art liquid crystal drive circuit.

FIG. 3 is an equivalent circuit illustration of when the AC signal e in the arrangement of FIG. 1 is conformed to the reference voltage, focusing only on a feedback loop.

Here, considering the DC potential, the following equation is obtained:

$$e_o = e_i - K \cdot (e_o - V_{ref}),$$

from which;

$$e_o = \{e_i/(1+K)\} + \{K \cdot V_{ref}/(1+K)\}$$

(Where, $e_i$ is an input signal, $e_o$ is the output signal, K is the gain of a feedback amplifier and $V_{ref}$ is the reference voltage.) Accordingly, in order to make the potential of the output to be as close to $V_{ref}$ as possible, it is desirable to increase the gain K as much as possible.

However, considering the AC component here, the following equation is obtained:

$$e_o=e_i-K\cdot e_o/(1+j\omega RC),$$

from which;

$$e_o=e_i/\{1+K/(1+j\omega RC)\}$$

That is, in the case when the frequency of $e_i$ is sufficiently high and the time constant of R·C is sufficiently large when compared to the gain K, $$K/j\omega RC \text{ is } 0,$$

resulting in $$e_o \approx e_i$$

and therefore, the input signal $e_i$ is scarcely affected by the feedback circuit, while it is to be affected by the feedback circuit as the frequency lowers and as the gain K increases.

In general, since an AC signal applied to a liquid crystal panel is of about $9V_{pp}$ at peak-to-peak in terms of a cycle per period of 1H of a video signal, a signal for this frequency component appears as being distorted due to an influence of the feedback circuit.

Although it would be better to set a larger value for the gain K in order to make the center potential of the output as close to $V_{ref}$ as possible, which is the original object for the feedback circuit, as a matter of course the larger the value of the gain K, the more the AC component is influenced by the feedback circuit. Also, with regard to the time constant RC, although it would be better to set it to a value as large as possible in order to reduce influence of the feedback circuit on the AC signal, there is a limit in practical use due to influence by a space for parts, leakage current from a condenser and input impedance of a comparator. The time constant and the gain K are appropriately determined in consideration of those points. In other words, the time constant and the gain are on the AC signal at a level which causes no troubles in practical use with the offsetting between the output DC potential and the reference voltage. Accordingly, there is a limit in error reduction between the central potential of the AC signal and $V_{ref}$.

As disclosed in Japanese patent publication No.122743/1994 and others, when a liquid crystal panel is driven using drivers of three RGB systems whose AC signals are different by 180 degrees in phase from the drivers of the conventional three RGB systems, there is an error in the output center voltage between certain colors, for example, between R1 output and R2 output, which has a larger effect on display quality when compared to an error between RGB signals in general. In other words, a difference between RGB signals, in respect of the display on certain liquid crystal panels, causes an overall difference between the liquid crystal panels, such as slight difference in white balance and degradation of contrast; whereas, a difference between R1 output and R2 output in the same liquid crystal panels causes a problem of vertical lines appearing on a screen due to difference in brightness because of difference occurring between picture elements in the liquid crystal panels, specifically between picture elements driven by the R1 output and picture elements driven by the R2 output. Accordingly, the difference in center potential between the respective output signals has to be further reduced. In the prior art, it is difficult to sufficiently reduce such difference to a level at which no practical problem occurs.

Figure 4:
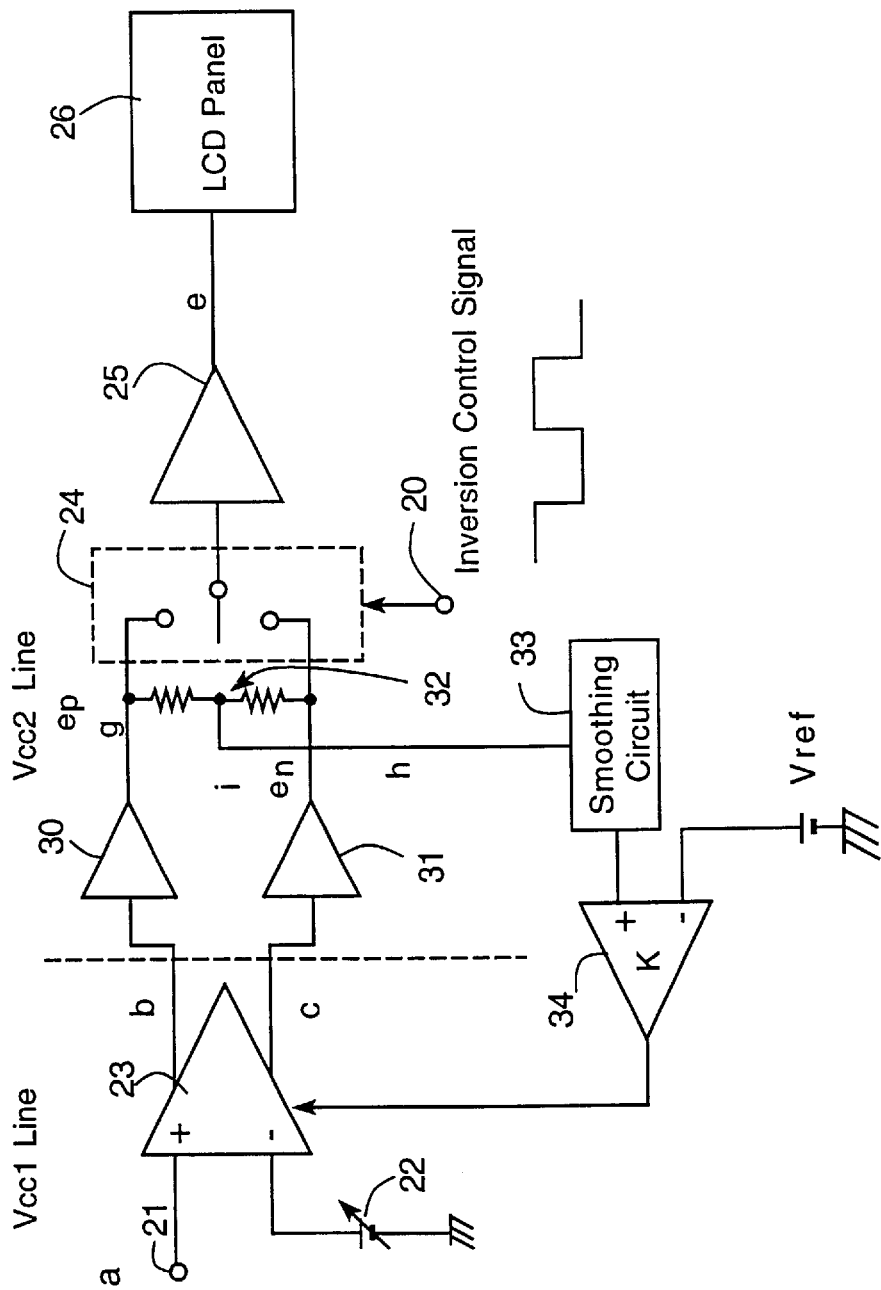
FIG. 4 is a block diagram showing a liquid crystal drive circuit in accordance with the present invention.

FIG. 4 shows a liquid crystal drive circuit in accordance with the present invention, in which a first buffer 30 receives one output signal b of the differential output amplifier 23 and provides a signal g. A second buffer 31 receives the other output signal c of the differential output amplifier 23 and produces a signal h. A mixer circuit 32 mixes an inverted video signal and an uninverted video signal to offset their AC components. After smoothing circuit 33, feedback amplifier 34 is provided for regulating DC outputs of the differential amplifier 23. Considering DC as an ideal state where there is no difference in AC level between an output $e_p$ of the first buffer 30 and an output $e_n$ of the second buffer 31:

$$e_o=e_p+e_n$$

Considering AC only, where $e_o$ is representative of an output signal of the mixer circuit 32, the output signal $e_o$ is applied through the smoothing circuit 33 to the feedback amplifier 34. The gain K of the feedback amplifier 34 represents gain of the feedback amplifier and $V_{ref}$ represents reference voltage. The output signal $e_c$ of the feedback amplifier 34 is:

$$e_c=K(e_o-V_{ref})$$

Figure 5:
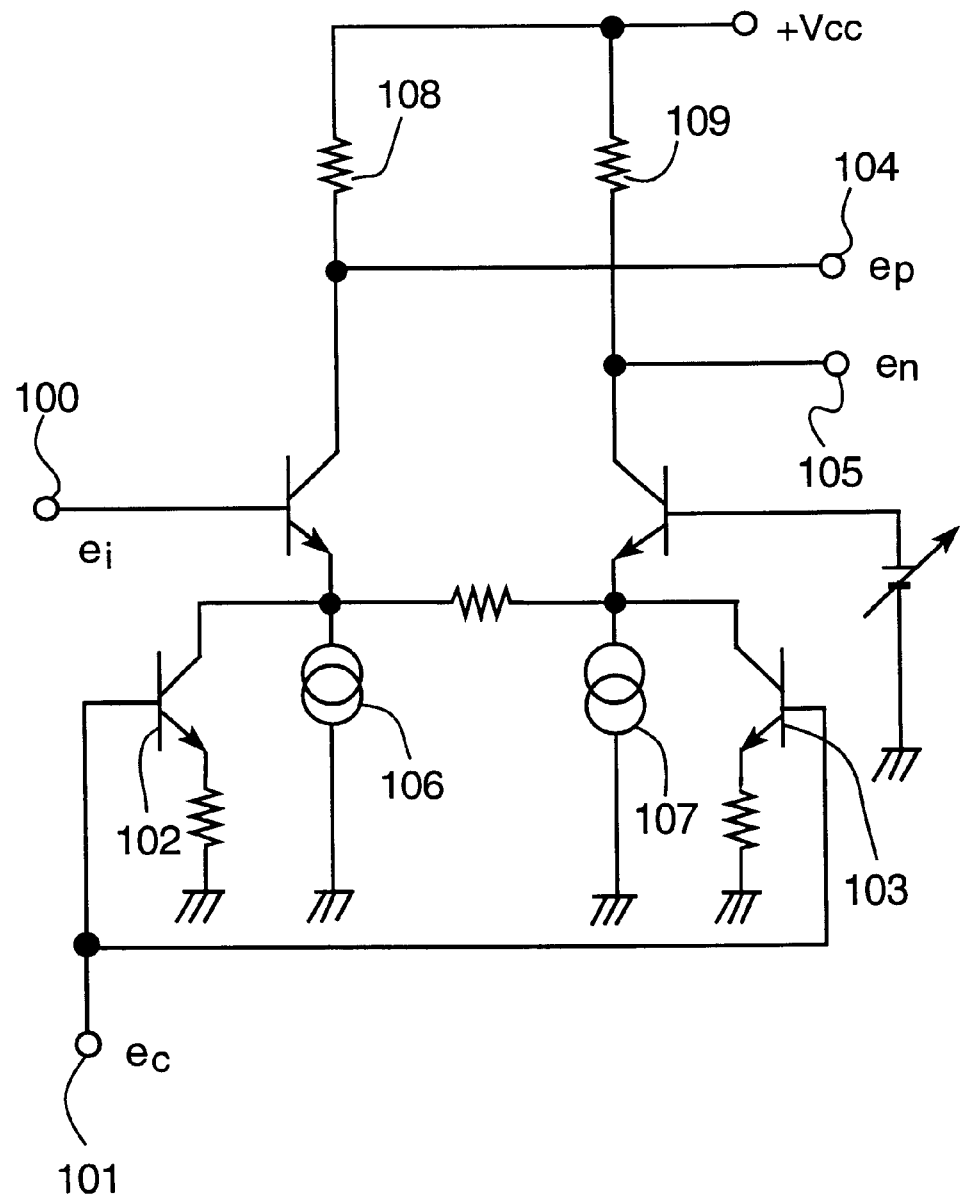
FIG. 5 is a detailed circuit diagram of a differential output amplifier in a liquid crystal drive circuit in accordance with the present invention.

A concrete example of the circuit of the differential output amplifier 23 is shown in FIG. 5. The output signal $e_c$ of the feedback amplifier 34 is applied to a terminal 100 in FIG. 5. When transistors 102 and 103 in FIG. 5 are turned off, the DC voltage of output terminals 104 and 105 is fixed at a value of constant current sources 106 and 107. In this situation, when the transistors 102 and 103 are turned on by feedback signals, the current flowing into the collector-emitter path of the transistors 102 and 103 is added to the flow through the resistors 108 and 109, whereupon the DC voltage of the output terminals 104 and 105 goes down. Consequently, output DC can be regulated by feedback signals by use of the differential output amplifier 23 in FIG. 5. Therefore, DC outputs $e_p$ and $e_n$ of the output terminals 104 and 105 are expressed as below:

$$e_p=e_i-e_c$$

$$e_n=-e_i-e_c$$

From the above equations, $$e_o=-2e_c$$

$$=-2K(e_o-V_{ref})$$

$$(1+2K)e_o=2KV_{ref}$$

Consequently, $$e_o=2K/(1+2K)V_{ref}$$

When K is sufficiently large, $$e_o \approx V_{ref}$$

and there is no influence of the input signal $e_i$.

Figure 7:
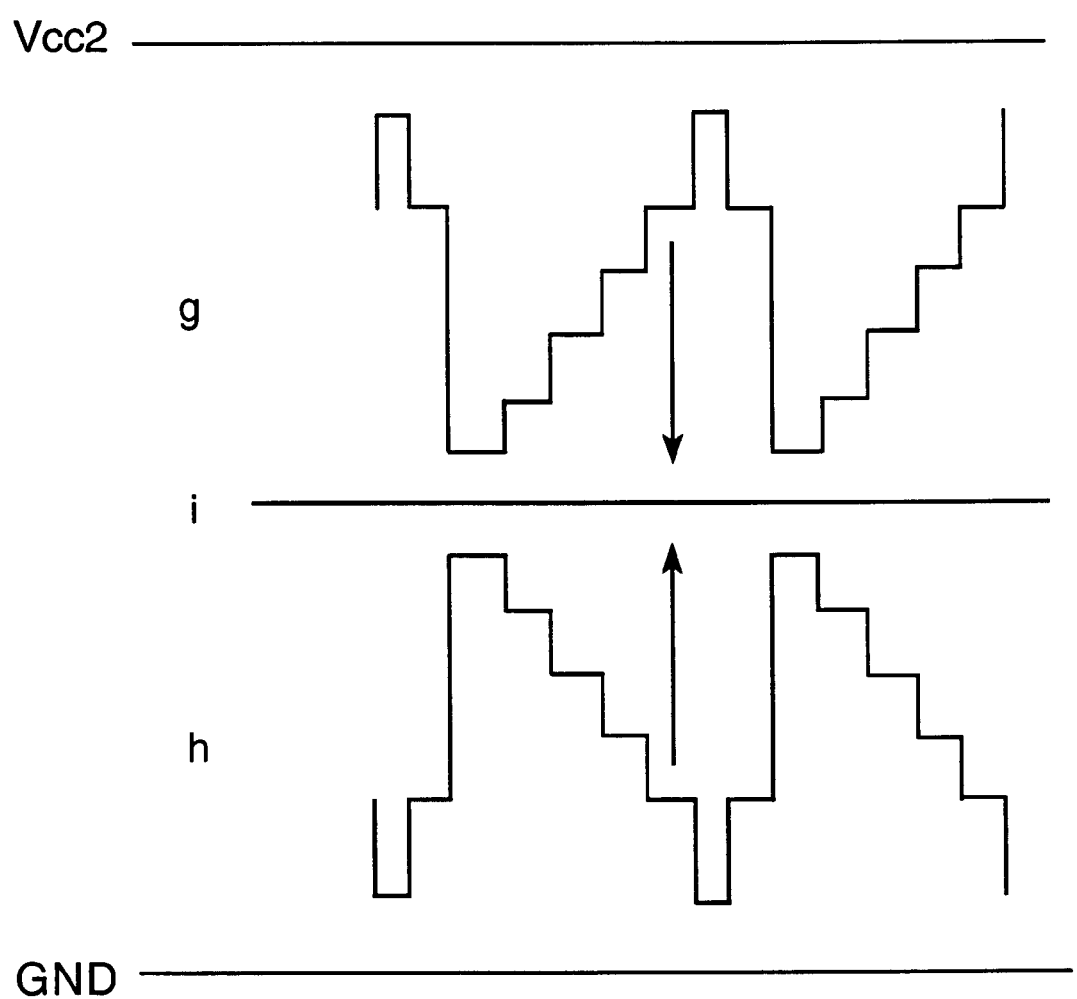
FIG. 7 is an illustration of wave patterns used in description of operation of a liquid crystal drive circuit in accordance with the present invention.

FIG. 7 shows relationship between the output signal g of the first buffer 30 and the output signal h of the second buffer 31, and an output signal i after mixing. Also, due to unintended difference between the resistors 108 and 109, there is a difference in AC level between the inverted signal and the non-inverted signal.

Now, assuming that the signal $e_p$ has increased $\alpha$ times as much as the signal $e_n$, the following equation is obtained;

$$e_o = \alpha e_p + e_n$$

Consequently, $$e_c = K \cdot e_o/(1+j\omega CR)$$

and then, $$e_p = e_i - e_c$$

$$e_n = -e_i - e_c$$

Therefore, $$e_o = [(\alpha-1) \cdot e_i]/\{1+[(\alpha+1) \cdot K/(1+j\omega CR)]\}$$

is obtained and $\alpha \approx 1$, i.e., when the frequency of $e_i$ is sufficiently higher and the time constant R·C is sufficiently larger than the gain K, the effects of the signal component $e_i$ can be disregarded. Here, considering the case where there is no integrating circuit, it follows that when the gain K is large, the influence of the signal $e_i$ on $e_c$ appears which has an effect on the non-inverted output signal $e_p$ and the inverted output signal $e_n$.

Figure 6:
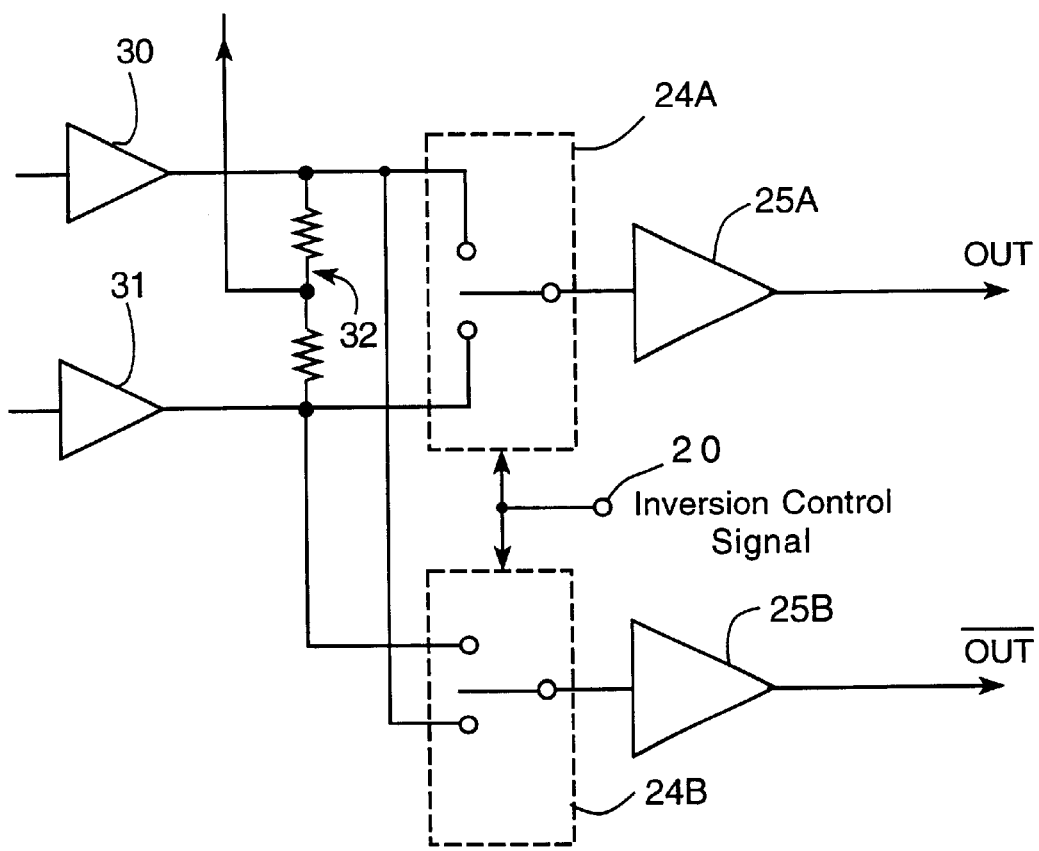
FIG. 6 is a detailed circuit diagram of a liquid crystal drive circuit in accordance with the present invention.

Also, by amplifying the non-inverted signal and the inverted signal in the stage prior to the multiplexer 24 to a signal level at which they are applied to the liquid crystal panel 26, the error voltage $e_o=2K/(1+2K) \cdot V_{ref}$ compared to the reference voltage is delivered without being amplified, and thus, the error compared to the reference voltage can be reduced. In FIG. 6, instead of the multiplexer 24 in FIG. 1, multiplexers 24A and 24B are provided, and instead of the amplifier 25, amplifiers 25A and 25B are provided. By selecting $e_p$ and $e_n$ with the multiplexer to produce outputs of AC signals different by 180° in phase, as shown in FIG. 6, the DC components of the output signals remain within difference in DC voltage between the multiplexer in the latter stage and the output buffer amplifier, and thus, difference in DC voltage between the output of the AC signals and the outputs different by 180° in phase therefrom can be eliminated. In conventional methods, to reduce the DC voltage difference, two systems have been required for each DC feedback circuit, while it is not possible to construction arrangement with only one system.

As have been described above, in accordance with one embodiment of the present invention, by adding an inverted signal and a non-inverted signal before mixing, the DC voltage output of the differential output amplifier is determined on the basis of the added signals.

When the inverted signal and the non- inverted signal are equal to each other in respect of gain error and frequency characteristic, said added signals are ideally DC signals.

Thus, the DC of the differential output amplifier can be determined without being influenced by an AC signal component and precise DC setting can be achieved. With such precise DC setting, a video signal can be displayed on an active matrix type liquid crystal panel without DC errors between the opposite electrodes.

Particularly, according to one embodiment of the present invention, as an inverted projected video signal and a non-inverted video signal of a mixer circuit are fed back after they have been amplified to a signal level required to be provided to a liquid crystal panel, difference of the output DC voltage compared to the reference voltage $V_{ref}$ is small.

Further, in accordance with one embodiment of the present invention, since potential resulted from mixing an inverted projected signal and a non-inverted projected signal is provided to a comparator after passing through an integrating circuit, DC can be correctly determined even if there is an error in the AC components between the two video signals.

A limited number of embodiments of the present invention have been described; nevertheless, it will be understood that various modifications may be made without departing from the spirit and scope of the invention. Accordingly, the invention is not limited to the embodiments specifically described and other embodiments are within the scope of the following claims.

What is claimed is:

1. A liquid crystal drive circuit for providing video signals to an active matrix type liquid crystal panel as AC signals in relation to polarity inversion of an opposed electrode, comprising:

an amplifier connected to receive an initial video signal from a source, said amplifier having outputs providing an inverted video signal and a non-inverted video signal, a mixer for cancelling AC components by mixing said inverted video signal and said non-inverted video signal, a feedback circuit, connected to said mixer, for regulating a DC level of said amplifier on the basis of an output signal from the mixer, and a multiplexer, connected to said mixer, for selecting between said inverted video signal and said non-inverted video signal in said mixer to produce an AC signal.

2. The liquid crystal drive circuit of claim 1 arranged for processing of video signals.

3. A liquid crystal drive circuit for supplying video signals to an active matrix type liquid crystal panel as AC signals in relation to polarity inversion of an opposed electrode, comprising:

a source of an initial video signal, an amplifier circuit connected to receive said initial video signal from said source, and having outputs which deliver an inverted video signal and a non-inverted video signal, a mixer circuit for offsetting AC components by mixing said inverted video signal and said non-inverted video signal, a multiplexer for selecting between said inverted video signal and said non-inverted video signal in said mixer circuit to produce an AC signal, and a feedback circuit connected to the mixer circuit, said feedback circuit comprising:

a source of a reference voltage, a comparator for amplifying differences in the amplitude of an output signal from said mixer circuit and said reference voltage, thereby regulating the DC level of said amplifier to that of the reference voltage on the basis of the output signal from said comparator.

4. A liquid crystal drive circuit as defined in claim 1, further comprising at least one amplifier for amplifying the inverted video signal and the non-inverted video signal in said mixer circuit up to the amplitude required for applying them to said liquid crystal panel.

5. A liquid crystal drive circuit as defined in claim 3, wherein the signal resulting from mixing of said inverted video signal and said non-inverted video signal is applied to an integrating circuit and the output of said integrating circuit is applied to said comparator.

6. A liquid crystal drive circuit for providing video signals to an active matrix type liquid crystal panel as AC signals in relation to polarity inversion of an opposed electrode, comprising:

means providing a video signal, an amplifier connected for receiving a video signal from said video signal means, and for delivering an inverted video signal and a non-inverted video signal, mixer means for cancelling AC components by mixing said inverted video signal and said non-inverted video signal to produce an output signal, and means, connected to the mixer means, for regulating a DC level of said amplifier on the basis of an output signal from said mixer means, and a multiplexing means, connected to said mixer means, for selecting between said inverted video signal and said non-inverted video signal in said mixer means to produce an AC signal.

7. A method for providing video signals to an active matrix type liquid crystal panel as AC signals in relation to polarity inversion of an opposed electrode, comprising:

producing an initial video signal representative of an image to be displayed, producing an inverted video signal and a non-inverted video signal, based on information in said initial video signal, cancelling AC components by mixing said inverted video signal and said non-inverted video signal to produce a mixer output signal, regulating the DC level applied to said liquid crystal panel on the basis of said mixer output signal, and multiplexing said inverted video signal and said non-inverted signal to produce an AC signal.

* * * * *